US006380317B1

(12) United States Patent
Malik et al.

(10) Patent No.: US 6,380,317 B1
(45) Date of Patent: Apr. 30, 2002

(54) PRODUCTION OF ACETAL DERIVATIZED HYDROXYL AROMATIC POLYMERS AND THEIR USE IN RADIATION SENSITIVE FORMULATIONS

(75) Inventors: Sanjay Malik, Attleboro; Andrew J. Blakeney, Seekonk; Lawrence Ferreira, Fall River; Joseph J. Sizensky, Seekonk, all of MA (US); Brian E. Maxwell, Rumford, RI (US)

(73) Assignee: Arch Specialty Chemicals, Inc., Norwalk, CT (US)

( * ) Notice: Subject to any disclaimer, the term of this patent is extended or adjusted under 35 U.S.C. 154(b) by 0 days.

(21) Appl. No.: 09/427,159

(22) Filed: Oct. 26, 1999

Related U.S. Application Data

(62) Division of application No. 09/059,864, filed on Apr. 14, 1998, now Pat. No. 6,159,653.

(51) Int. Cl.[7] .................... C08F 257/00; G03F 7/039
(52) U.S. Cl. .................... 525/266; 525/312; 525/384
(58) Field of Search .................... 525/193, 333.3, 525/385, 384, 266, 312; 526/313

(56) References Cited

U.S. PATENT DOCUMENTS

| | | | |
|---|---|---|---|
| 5,035,979 A | 7/1991 | Nguyen-Kim et al. ... | 430/270.1 |
| 5,069,997 A | 12/1991 | Schwalm et al. ........ | 430/270.1 |
| 5,389,494 A | 2/1995 | Kim ........................ | 430/270.1 |
| 5,468,589 A * | 11/1995 | Urano et al. ................ | 430/170 |
| 5,558,978 A | 9/1996 | Schadeli et al. ......... | 430/270.1 |
| 5,593,812 A | 1/1997 | Babich et al. ........... | 430/270.1 |
| 5,670,299 A | 9/1997 | Urano et al. ................ | 430/326 |
| 6,133,412 A | 10/2000 | Malik et al. ................ | 528/425 |
| 6,159,653 A * | 12/2000 | Malik et al. ............. | 430/270.1 |
| 6,309,793 B1 * | 10/2001 | Malik et al. ................ | 430/170 |

* cited by examiner

*Primary Examiner*—John S. Chu
(74) *Attorney, Agent, or Firm*—Ohlandt, Greeley, Ruggiero & Perle, LLP

(57) ABSTRACT

The present invention provides a process for generating mixed acetal polymers by reacting a hydroxyl containing polymer or monomer with vinyl ether and alcohol in the presence of an acid catalyst. The process of this invention provides a new class of polymers based on mixed acetals which are prepared in-situ with one reaction. The mixed acetal polymers are inexpensive to synthesize and readily reproducible. The resulting mixed acetal polymer is blended with a photoacid generator and dissolved in a solvent to produce a chemically amplified resist composition. A process for forming a pattern comprises the steps of providing the chemically amplified resist composition, coating a substrate with the resist composition, imagewise exposing the resist coated substrate to actinic radiation, and forming a resist image by developing the resist coated substrate.

10 Claims, No Drawings

US 6,380,317 B1

PRODUCTION OF ACETAL DERIVATIZED HYDROXYL AROMATIC POLYMERS AND THEIR USE IN RADIATION SENSITIVE FORMULATIONS

This application is a divisional of application Ser. No. 09/059,864 filed Apr. 14, 1998, now U.S. Pat. No. 6,159,653.

FIELD OF THE INVENTION

The present invention relates to acetal derivatized polymers that have applications in the imaging industry as a photoresist resin for lithography and to a process for producing said acetal derivatized polymers.

BACKGROUND TO THE INVENTION

The wavelength of light for lithography has been reduced into the deep ultraviolet (DUV) range to produce the feature size necessary for current and future electronics devices. The electronics industry is developing new resists that are tailored to the DUV range. One such resist class is chemically amplified resists.

The main components of chemically amplified resist formulations are a photoacid generator compound, a polymer resin and a solvent capable of dissolving the photogenerator and the resin. For many positive chemically amplified resists, the polymer resin contains acid labile groups which makes the polymer resin insoluble in an aqueous developer. Upon irradiation, the photoacid generator compound produces an acid which cleaves the acid labile groups resulting in a polymer resin that is aqueous soluble. Chemically amplified resists have generated a great deal of interest and there are numerous patents available discussing these compositions such as, for example, U.S. Pat. Nos. 5,069,997; 5,035,979; 5,670,299; 5,558,978; 5,468,589; and 5,389,494.

One group of polymers which can be used as resins in chemically amplified resists are acetal derivatized polymers. The alkali solubility of phenolic resins are greatly inhibited by converting the hydroxyl groups to acetal groups. Typically, acetal phenolic resins are produced by reacting a phenolic resin with a vinyl ether in the presence of an acid catalyst.

The acetal resins are then formulated with a photoacid generator compound and solvent to form a chemically amplified resist product. Upon irradiation, the generated acid cleaves the acetal groups, and a phenolic resin is created which is soluble in an aqueous developer.

One problem with producing acetal derivatized polymers is that currently there are only a very limited number of bulk vinyl ethers that can be used to produce the acetals. It is possible to generate other acetal functionalities by synthesizing intermediates, but this would require a series of reactions which makes the overall process for producing acetal polymers relatively complicated, expensive, and unlikely to be reproducible. Thus, the limited number of bulk vinyl ethers severely constrains the use of acetal polymers because only a small number of acetal groups can be readily and inexpensively generated.

It would be advantageous to be able to generate reproducibly and economically a large variety of acetal groups on polymers. Various resist properties such as alkaline solubility, etch resistance, film shrinkage, temperature stability, adhesion, sensitivity can be altered by choosing appropriate acetal functionalities. Furthermore, if more than one acetal group can be readily generated on the polymer, this would provide further ability to tailor the polymer resin to a specific application. For example, one acetal group may be used to increase the sensitivity, while another acetal group may be used to increase the etch resistance. The host of applications for acetal polymers can be greatly expanded if a large variety of acetal groups on the polymers can be produced readily.

The present inventors have developed a reproducible process for readily producing a wide variety of acetal derivatized polymers.

It is another object of this invention to provide a new, inexpensive, reproducible process for generating a large variety of acetal derivatized polymers that have applications as resins for photoresists.

It is a further object of this invention to provide a process for generating a large variety of acetal derivatized polymers based on mixed acetals. A still further object of this invention is to provide a variety of mixed acetals derivatized polymers that have applications as resins for photoresist. Yet another object of this invention is to provide new photoresist compositions containing mixed acetal derivatized polymers and the use of such new photoresist compositions in photolithography imaging processes to produce microelectronic devices. The present invention has many important advantages over the prior art, First, the present invention provides a new class of polymers based on mixed acetals. Desired properties of the polymer resin can be tailored by choosing among appropriate acetal functionalities. Also, the relative proportions of the different acetals in the polymer can be readily varied by changing the relative proportions of reagents in the feedstock. Changing the proportion of the mixed acetals can further tailor the properties of the polymer resin. In addition, the reproducibility of the mixed acetal polymers compositions are excellent. Reproducible polymer compositions are very important in order to produce commercially viable resist formulations because the properties of the resist must not change from batch to batch. Furthermore, the mixed acetal process is relatively inexpensive because intermediates needed for the reaction are commercially available and only one synthesis reaction is required to produce the final acetal polymer. Previously, a number of synthesis reactions would generally be required to produce the final single acetal polymer if the acetal group was not from one of the readily available vinyl ethers.

The present invention also provides many additional advantages which shall become apparent as described below.

SUMMARY OF THE INVENTION

The present invention readily generates a large variety of acetal derivatized polymers in a relatively simple, inexpensive, and reproducible manner. Also, a new class of polymers based on mixed acetals are produced by this invention. The acetal polymer can then be blended with a photoacid generator in a solvent to formulate a chemically amplified resist composition which is used in the production of electronics devices. The large variety of acetal derivatized polymers which can be produced by this process will make it easier to alter the various lithographic resist properties by choosing appropriate acetal functionalities tailored for a specific application The general process for generating an acetal resin according to the present invention comprises the steps of providing a polymer with one or more monomer units, wherein at least one of the monomer units contain one or more pendant hydroxyl group; and reacting said polymer with a vinyl ether of the formula $R_7R_6C=CH-OR_1$ and an alcohol of the formula $R_2OH$ in the presence of an acid catalyst, wherein $R_1$ is a linear, branched or cyclic alkyl group preferably having 1 to 10 carbon atoms, a linear, branched or cyclic haloalkyl group preferably having 1 to 10 carbon atoms, an aralkyl group or a substituted phenylmethylene having the general structure;

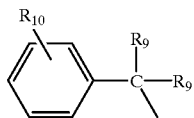

wherein each $R_9$ and $R_{10}$ are the same or independently a hydrogen or an alkyl group having 1 to 6 carbons; $R_2$ is a linear, branched or cyclic alkyl group preferably having 1 to 10 carbon atoms, a linear, branched or cyclic halogenated alkyl group preferably having 1 to 10 carbon atoms, or an aromatic group or a substituted phenylmethylene having the general structure

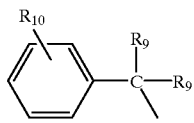

wherein $R_9$ and $R_{10}$ are as defined above; $R_1$ and $R_2$ are different from each other, $R_6$ and $R_7$ are the same or independently a hydrogen, a linear, branched or cyclic alkyl group preferably having 1 to 10 carbon atoms, a linear, branched or cyclic haloalkyl group at preferably having 1 to 10 carbon atoms, an aryl group, an aralkyl group, a substituted haloaryl, alkoxyaryl or alkylaryl group, or a combination of $R_6$ and $R_7$ being able to form an alkylene chain, an alkyl substituted alkylene chain, or an oxyalkylene chain.

A more specific process for producing acetal derivatized polymers utilizes a phenolic based polymer. The phenolic based polymer is reacted with a vinyl ether and an alcohol in the presence of an acid catalyst to produce a polymer with mixed acetals from both the vinyl ether and the alcohol. One such acetal reaction of the phenolic based polymer (polyhydroxystyrene) is represented by the monomer units of equation 1.

Equation 1

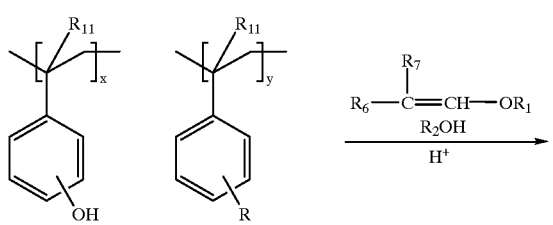

-continued

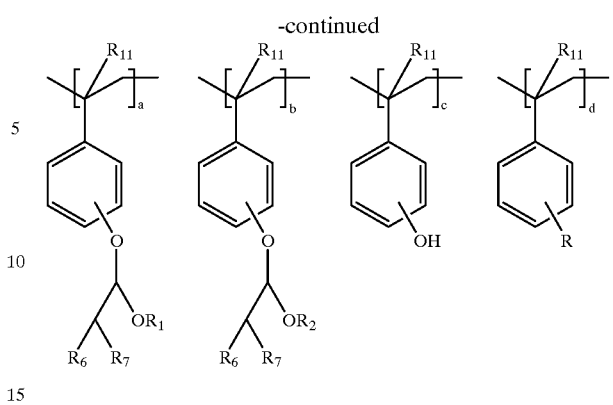

wherein R is a hydrogen, an alkyl group preferably having 1 to 6 carbon atoms, an alkoxy group preferably having 1 to 6 carbon atoms or an acetoxy group; $R_1$ is a linear, branched or cyclic alkyl group preferably having 1 to 10 carbon atoms, a linear, branched or cyclic haloalkyl group preferably having 1 to 10 carbon atoms, an aralkyl group or a substituted phenylmethylene having the general structure

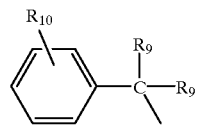

wherein each $R_9$ and $R_{10}$ are the same or independently a hydrogen or an alkyl group having 1 to 6 carbons; $R_2$ is a linear, branched or cyclic alkyl group preferably having 1 to 10 carbon atoms, a linear, branched or cyclic halogenated alkyl group preferably having 1 to 10 carbon atoms, an aromatic group or a substituted phenylmethylene having the general structure

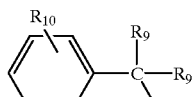

wherein $R_9$ and $R_{10}$ are as defined above; $R_1$ and $R_2$ are not the same; $R_6$ and $R_7$ are the same or independently a linear, branched or cyclic alkyl group preferably having 1 to 10 carbon atoms, a linear, branched or cyclic haloalkyl group preferably having 1 to 10 carbon atoms, an aryl group, an aralkyl group, a substituted haloaryl, alkoxyaryl or alkylaryl group, or a combination of $R_6$ and $R_7$ being able to form an alkylene chain, an alkyl substituted alkylene chain, or an oxyalkylene chain; $R_{11}$ is hydrogen or methyl; x=0.6 to 1; y=0 to 0.4; and x+y=1.0; $0<a\leq0.6$; $0<b\leq0.6$; $0<a+b\leq0.6$; $0.4\leq c+d<1.0$; and a+b+c+d=1.0; and where all numbers represent mole fractions.

The process of this invention provides a new class of polymers based on mixed acetals which are prepared in-situ with one reaction. The mixed acetal polymers are inexpensive to synthesize and readily reproducible.

The invention also provides that the resulting mixed acetal polymer is blended with a photoacid generator and dissolved in a solvent to produce a chemically amplified resist composition. Other components to the resist composition can be added such as dyes, surfactants and stabilizers, and the like.

This invention further provides a process for forming a pattern which comprises the steps of providing the chemically amplified resist composition with the mixed acetal polymer, coating a substrate with the resist composition, imagewise exposing the resist coated substrate to actinic radiation, and forming a resist by developing the resist coated substrate. Further processing of the substrate may take place after the formation of the resist image.

Other and farther objects, advantages and features of the present invention will be understood by reference to the following specification.

DETAILED DESCRIPTION AND EMBODIMENTS

The process for producing the acetal derivatized polymers, the photoresist compositions containing the acetal polymer, and the process steps for producing the resist image in accordance with the present invention are as follows.

The process for producing the acetal derivatized polymers comprises reacting a hydroxyl based polymer with a vinyl ether and alcohol in the presence of an acid catalyst to produce a polymer with acetals from both the vinyl ether and the alcohol. The preferred hydroxyl based polymers are phenolic based polymers and the more preferable phenolic based polymers are novolaks and polyhydroxystyrene (PHS). One such reaction of the phenolic based polymer PHS is represented by the aforementioned equation 1.

Equation 1

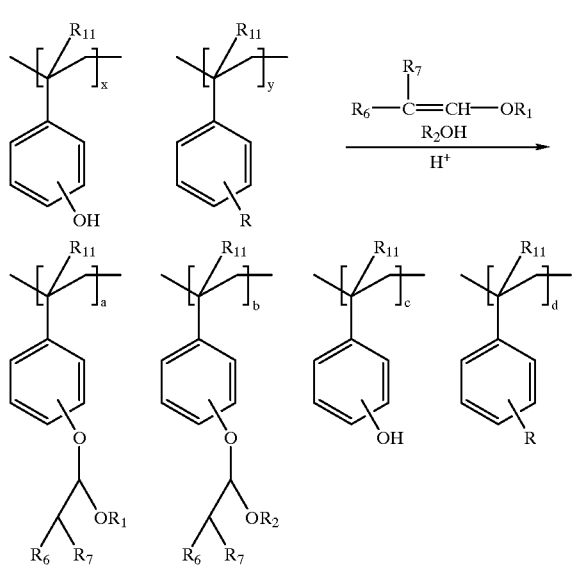

wherein; R is a hydrogen, an alkyl group preferably having 1 to 6 carbon atoms, an alkoxy group preferably having 1 to 6 carbon atoms or an acetoxy group; $R_1$ is a linear, branched or cyclic alkyl group preferably having 1 to 10 carbon atoms, a linear, branched or cyclic haloalkyl group preferably having 1 to 10 carbon atoms, an aralkyl group, or a substituted phenylmethylene having the general structure

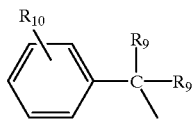

wherein each $R_9$ and $R_{10}$ are the same or independently a hydrogen or an alkyl group having 1 to 6 carbons; $R_2$ is a linear, branched or cyclic alkyl group preferably having 1 to 10 carbon atoms, a linear, branched or cyclic halogenated alkyl group preferably having 1 to 10 carbon atoms, an aromatic group, or a substituted phenylmethylene having the general structure

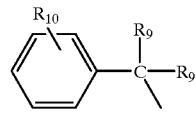

wherein $R_9$ and $R_{10}$ are as defined above; $R_1$ and $R_2$ are not the same; $R_6$ and $R_7$ are the same or independently a hydrogen, a linear, branched or cyclic alkyl group preferably having 1 to 10 carbon atoms, a linear, branched or cyclic haloalkyl group preferably having 1 to 10 carbon atoms, an aryl group, an aralkyl group, a substituted haloaryl, alkoxyaryl or alkylaryl group, or a combination of $R_6$ and $R_7$ being able to form an alkylene chain, an alkyl substituted alkylene chain, or an oxyalkylene chain; $R_{11}$ is hydrogen or methyl; x=0.6 to 1; y=0 to 0.4; and x+y=1.0; 0<a≦0.6; 0<b≦0.6; 0<a+b≦0.6; 0.4≦c+d<1.0; and a+b+c+d=1.0; and where all numbers represent mole fractions.

Any suitable vinyl ethers may be used for the acetalization process. The alkyl groups represented by $R_1$ include, but are not limited to, methyl, ethyl, propyl, butyl, amyl, hexyl, heptyl, octyl, nonyl, decyl, undecyl, dodecyl, and the like. The halogens of the haloalkyl represented by $R_1$ include chlorine, bromine, fluorine, and iodine. The aralkyl groups represented by $R_1$ include, but are not limited to, benzyl, phenethyl, phenylpropyl, methylbenzyl, methylphenethyl and ethylbenzyl. The preferable $R_1$ groups are secondary and tertiary alkyls preferably having from 1 to 6 carbon atoms. The more preferable $R_1$ groups are tertiary alkyls. The most preferred $R_1$ is tertiary-butyl.

The alkyl groups represented by $R_6$ and $R_7$ include, but are not limited to, methyl, ethyl, propyl, butyl, amyl, hexyl, heptyl, octyl, nonyl, decyl, undecyl, dodecyl, and the like. The halogens of the haloalkyl represented by $R_6$ and $R_7$ include chlorine, bromine, fluorine, and iodine. The aralkyl groups represented by $R_6$ and $R_7$ include, but are not limited to, benzyl, phenethyl, phenylpropyl, methylbeneyl, methylphenethyl and ethylbenzyl. Suitable examples of the combination of $R_6$ and $R_7$ forming a chain are cyclohexane, methylcyclohexane and pyran. The preferred $R_6$ and $R_7$ are hydrogen.

The more preferred vinyl ethers are the readily available bulk vinyl ethers; ethyl vinyl other, tertiary-butyl vinyl ether and cyclohexyl vinyl ether.

Also, any suitable alcohol may be used for the reaction. The alkyl groups represented by $R_2$ include, but are not limited to, methyl, ethyl, propyl, butyl amyl, hexyl, heptyl, octyl, nonyl, decyl, undecyl, dodecyl, and the like. The halogens of the haloalkyl represented by $R_2$ include chlorine, bromine, fluorine, and iodine. The aromatic group represented by $R_2$ include, but are not limited to, phenyl, benzyl, phenethyl, phenylpropyl, naphthyl, napthyl ethyl, methylbenzyl, methylphenethyl and ethylbenzyl. Preferred alcohols are 2,2,3,3-tetrafluoro propyl alcohol, cyclohexyl ethyl alcohol, (1R)-(−)-nopol, benzyl alcohol, phenethyl alcohol 1-naphthol, 2-naphthol and naphthyl ethanol.

The alkyl group represented by R include, but are not limited to, methyl, ethyl, propyl, butyl, amyl, hexyl, heptyl, octyl, nonyl, decyl, undecyl, dodecyl, and the like. The alkoxy group represented by R include, but are not limited to methoxy, ethoxy, propoxy, butoxy, amoxy, hexoxy, heptoxy, octoxy, nonoxy, decoxy, undecoxy, dodecoxy, and the like. The preferred R groups are hydrogen or tertiary-butyl.

The preferred % acetalization $((a+b)/(a+b+c)) \times 100$ is about 10% to about 35%. The preferred percent $R_2$ incorporated in the polymer is about 80% to less than 100% of the total acetalization.

Although the embodiments are based on polyhydroxystyrene, (PHS), which is typically used as a resin for DUV litography, it should be noted that any hydroxyl containing polymer may be used to produce mixed acetals using this process because the acetalization occurs at the hydroxyl site. For example, instead of having a phenolic resin, a cyclohexanol or a mixed cyclohexanol-phenolic based polymer may be used. The acetal groups will be generated at the hydroxyl site, and a mixed acetal polymer based on cyclohexane will result.

Other suitable polymers for this process are novolaks which are typically used as resins for photoresist. The hydroxyl sites of novolaks may be also be acetalized with the present process.

It should also be noted that each repeating unit of the polymer may contain one or more hydroxyl groups. For example, the polymer may contain a dihydroxy phenyl repeating unit. The acetalization reaction may occur on none, either, or both hydroxyl sites depending on the overall degree of acetalization.

The overall degree of acetalization of the hydroxyl sites is controlled by the amount of vinyl ether used in the feedstock. The relative ratios of $R_1$ and $R_2$ in the acetal derivatized polymer can be controlled by the relative amounts of vinyl ether and alcohol respectively used in the feedstock. The proportion of $R_2$ acetals in the polymer increases relative to $R_1$ as the amount of alcohol $R_2OH$ used in the feedstock increases.

In a typical synthesis procedure, an hydroxyl based polymer or copolymer is dissolved in any suitable solvent or solvent mixture. The solvent present should be inert under the reaction conditions. Suitable solvents may include aromatic hydrocarbons, chlorinated hydrocarbons, esters, and ethers such as tetrahydrofuran, (THF), 1,4-dioxane, methylene chloride, propylene glycol monomethyl ether acetate, (PGMEA), and dimethoxyethane. Preferred solvents for the reaction are THF and PGMEA.

To such a solvent, the vinyl ether and the alcohol are added at room temperature. The desired concentration of polymer or copolymer dissolved in the solvent is about 10 weight percent to about 60 weight percent. The amounts of vinyl ether may vary from about 0.01 mole percent to about 60 mole percent of the total moles of phenolic hydroxyl groups. The preferable range of vinyl ether is about 15 mole percent to about 40 mole percent. The amount of alcohol used may vary from about 0.01 mole percent to about 110 mole percent of the amount of vinyl ether used.

An acid catalyst is added and the reaction mixture is allowed to stir for about 4 to about 24 hours. The preferred reaction time is about 20 hours. Any suitable acid catalyst may be used for the reaction such as hydrochloric acid, sulfuric acid, para-toluene sulfonic acid and pyridinium-para-toluene sulfonate. The preferred acid catalyst is pyridinium-para-toluene sulfonate. The acid catalyst may be added in amounts ranging from about 0.001 weight percent to about 3.0 weight percent based on the weight of the polymer. The preferred amount of acid catalyst added is about 0.005 weight percent. The acid catalyst is normally quenched with an organic or inorganic base. The acetal derived hydroxystyrene based polymer is isolated by any suitable polymer isolation procedure such as by precipitation in a non-solvent.

It will be appreciated that although this invention is described by reacting vinyl ether and alcohol with a hydroxyl based polymer in the presence of an acid catalyst, the acetal polymers can also be generated by first reacting the vinyl ether and alcohol with monomers and then polymerizing the subsequent monomer mixture. For example, a preferred process would be to provide hydroxystyrene monomers and react said monomers with vinyl ether and alcohol in the presence of an acid catalyst to form mixed acetal monomers. The mixture of monomers can then be polymerized by any suitable polymerization process, such as using free radical initiation, to form the mixed acetal polymers. One skilled in the art of polymerization could choose the appropriate polymerization process.

In an another embodiment of the invention, the structure of the backbone in the polymer reactant may be modified to include other monomers such as acrylates, methacrylates and itaconates to form mixed acetal copolymers, such as the following monomer units according to equation 2:

Equation 2

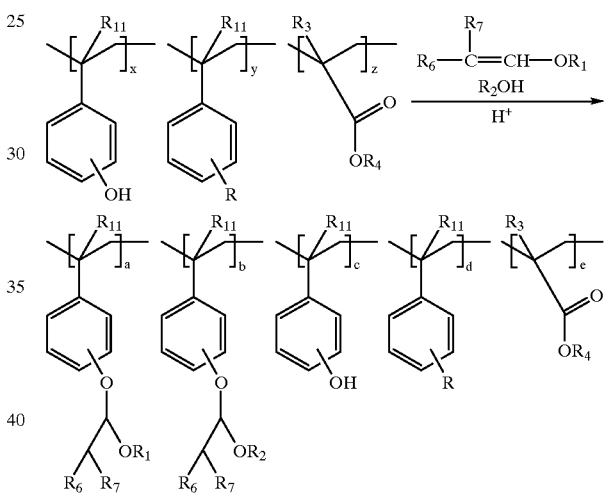

wherein R, $R_1$, $R_2$, $R_6$, $R_7$ and $R_{11}$ are defined above; $R_1$ and $R_2$ are not the same; $R_3$ is a hydrogen atom, methyl or ethyl group, or a group having the formula $-CH_2-COOR_8$; $R_4$ and $R_8$ are the same or independently a linear, branched or cyclic alkyl group preferably having 1 to 12 carbon atoms, a linear, branched or cyclic halogenated allyl group preferably having 1 to 12 carbon atoms, an aromatic group or a linear or cyclic α-alkoxyalkyl group; x=0.6 to 1; y=0 to 0.4; z=0 to 0.4; $0<a\leq0.6$; $0<b\leq0.6$; $0<a+b\leq0.6$; $0.4\leq c+d+e<1.0$; a+b+c+d+e=1.0; and where all numbers represent mole fractions.

The alkyl groups represented by $R_4$ and $R_8$ include, but are not limited to, methyl, ethyl propyl, butyl, amyl, hexyl, heptyl, octyl, nonyl, decyl, undecyl, dodecyl, and the like. The halogens of the haloalkyl represented by $R_4$ include chlorine, bromine, fluorine, and iodine. The aromatic groups represented by $R_4$ include, but are not limited to, benzyl, phenethyl, phenylpropyl, methylbenzyl, methylphenethyl and ethylbenzyl. Preferred $R_4$ groups are methyl, ethyl, 2-hydroxy ethyl, propyl isopropyl, n-butyl, t-butyl, 2-ethyl hexyl, and tetrahydropyranyl.

In a further embodiment of the invention, the acetal-derivatized hydroxyl containing polymers, such as the hydroxystyrene based polymers and copolymers of equation 1 and 2, may further be modified to incorporate a tertiary butoxycarbonyloxy (t-BOC) or tertiary-butyloxycarbonyl-methoxy (BOCMe) functional groups. The t-BOC functional group can be introduced by reacting the polymers or copolymers of equation 1 and 2 with di-tertiary-butyl dicarbonate in the presence of any suitable organic or inorganic base such as dimethyl amino pyridine. Similarly, BOCMe functional group can be introduced by reacting the polymers or copolymers of equation 1 and 2 with tertiary-butyl bromoacetate. With these modifications, the monomer units of the derivative polymer of hydroxystyrene would be as follows:

Formula V

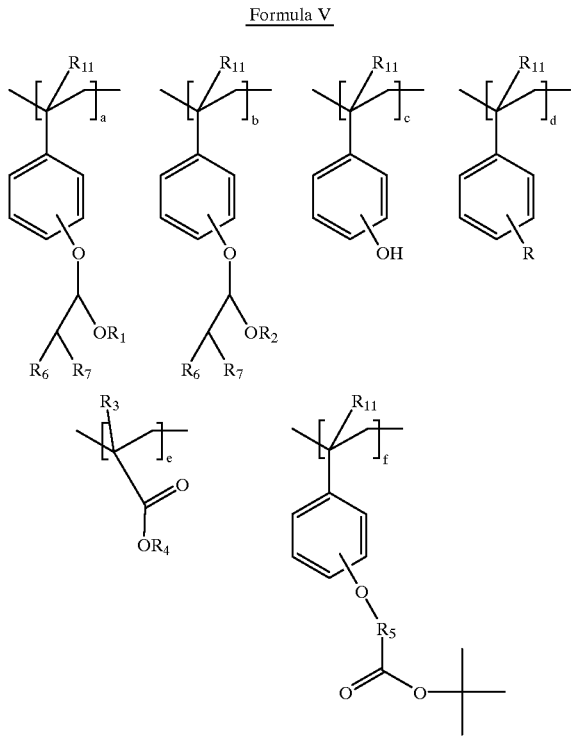

wherein R $R_1$, $R_2$, $R_3$, $R_4$ $R_6$, $R_7$, $R_8$ and $R_{11}$ are as defined above; $R_1$ and $R_2$ are not the same, $R_5$ is a valence bond or methylene, $0<a\leq0.6$; $0<b\leq0.6$; $f=0$ to $0.10$; $0<a+b+f\leq0.6$; $0.4\leq c+d+e<1.0$; $a+b+c+d+e+f1.0$; and where all numbers represent mole fractions.

A preferred embodiment of the invention is the acetal polymer of formula V wherein $R_1$ is tertiary-butyl, $R_2$ is phenethyl, $R_6$ and $R_7$ are hydrogen, $R_{11}$ is hydrogen, d is 0, e is 0, f is 0, $0.1\leq((a+b)/(a+b+c))\leq0.35$; $0.8\leq(b/(a+b))<1$.

Another preferred embodiment of the invention is the acetal polymer of formula V wherein $R_1$ is tertiary-butyl, $R_2$ is phenethyl $R_6$ and $R_7$ are hydrogen, $R_{11}$ is hydrogen, e is 0, f is 0, d is 0.05 to 0.25; R is tertiary-butyl; $0.1\leq((a+b)/(a+b+c))\leq0.35$; $0.8\leq(b/(a+b))<1$.

Still another preferred embodiment of the invention is the acetal polymer of formula V wherein $R_1$ is tertiary-butl, $R_2$ is phenethyl $R_6$ and $R_7$ are hydrogen, $R_{11}$ is hydrogen, e is 0, f is 0, d is 0.05 to 0.25; R is hydrogen; $0.1\leq((a+b)/(a+b+c))\leq0.35$; $0.8\leq(b/(a+b))<1$.

A further preferred embodiment of the invention is the acetal polymer of formula V wherein $R_1$ is tertiary-buty, $R_2$ is cyclohexyl ethyl, $R_6$ and $R_7$ are hydrogen, $R_{11}$ is hydrogen, e is 0, f is 0, d is 0.05 to 0.25; R is tertiary-butyl; $0.1\leq((a+b)/(a+b+c))\leq0.35$; $0.8:\leq(b/(a+b))<1$.

A still further preferred embodiment of the invention is the acetal polymer of formula V wherein $R_1$ is tertiary-butyl, $R_2$ is phenethyl, $R_6$ and $R_7$ are hydrogen, $R_{11}$ is hydrogen, d is 0, f is 0, $0<e\leq0.4$; $R_3$ is hydrogen; $R_4$ is tertiary-butyl; $0.1\leq((a+b)/(a+b+c))\leq0.35$; $0.8\leq(b/(a+b))<1$.

Another preferred embodiment of the invention is the acetal polymer of the formula V wherein $R_1$ is tertiary-butyl, $R_2$ is phenethyl, $R_6$ and $R_7$ are hydrogen, $R_{11}$ is hydrogen, d is 0, $0<f\leq0.08$, e is 0; $R_5$ is a valence bond; $0.1\leq((a+b)/(a+b+c))\leq0.35$; $0.8\leq(b/(a+b))<1$.

The invention further relates to the formulation of photoresist compositions comprising a mixed acetal derivatized polymer as produced above, a photoacid generator and a solvent capable of dissolving both the acetal derivatized polymer and the photoacid generator. The preferred acetal polymers for the photoresist compositions are those that were previously described in the preferred acetal polymer embodiments above.

Any suitable photoacid generator compounds may be used in the photoresist composition. The photoacid generator compounds are well known and include, for example, onium salts such as diazonim, sulfonium, sulfoxonium and iodonium salts, and disulfones. Suitable photoacid generator compounds are disclosed, for example, in U.S. Pat. No. 5,558,978 and. U.S. Pat. No. 5,468,589 which are incorporated herein by reference.

Suitable examples of photoacid generators are phenacyl p-methylbenzenesulfonate, benzoin p-toluenesulfonate, α-(p-toluene-sulfonyloxy)methylbenzoin 3-p-toluenesulfonyloxy)-2-hydroxy-2-phenyl-1-phenylpropyl ether, N-(p-dodecylbenzenesulfonyloxy)-1,8-naphthalimide and N-(phenyl-sulfonyloxy)-1,8-napthalimide.

Other suitable compounds are o-nitrobenzaldehydes which rearrange on actinic irradiation to give o-nitrosobenzoic acids such as 1-nitrobenzaldehyde and 2,6-nitrobenzaldehyde, α-haloacylphenones such as α,α,α-trichloroacetophenone and p-tert-butyl-α,α,α-trichloroacetophenone, and sulfonic esters of o-hydroxyacylphenones, such as 2-hydroxybenzophenone methanesulfonate and 2,4-hydroxybenzophenone bis (methanesulfonate).

Still other suitable examples of photoacid generators are triphenylsulfonium bromide, triphenylsulfonium chloride, triphenylsulfonium iodide, triphenylsulfonium hexafluorophosphate, triphenylsulfonium hauoroarsenate, triphenylsulfonium hexafluoroarsenate, triphenylsulfonium trifluoromethanesulfonate, diphenylethylsulfonium chloride, phenacyldimethylsulfonium chloride, phenacyltetrahydrothiophenium chloride, 4-nitrophenacyltetrahydrothiopheniumn chloride and 4-hydroxy-2-methylphonylhexahydrothiopyqylium chloride.

Further examples of suitable photoacid generators for use in this invention are bis(p-toluenesulfonyl)diazomethane, methylsulfonyl p-toluenesulfonyldiazomethane, 1-cyclohexylsulfonyl-1-(1,1-dimethylethylsulfonyl)diazometane, bis(1,1-dimethylethylsulfonyl)diazomethane, bis(1-methylethylsulfonyl)diazomethane, bis(cyclohexylsulfonyl) diazomethane, 1-p-toluenesulfonyl-1-cyclohexylcarbonyldiazomethane, 2-methyl-2-(p-toluenesulfonyl)propiophenone, 2-methanesulfonyl-2-methyl-(4-methylthiopropiophenone, 2,4-methyl-2-(p-toluenesulfonyl)pent-3-one, 1-diazo-1-methylsulfonyl-4-phenyl-2-butanone, 2-(cyclohexylcarbonyl-2-(p-toluenesulfonyl)propane, 1-cyclohexylsulfonyl-1cyclohexylcarbonyldiazomethane, 1-diazo-1- cyclohexylsulfonyl-3,3-dimethyl-2-butanone, 1-diazo-1-(1,1-dinmethylethylsu1fonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl-2-diazo-2-methanesulfonylacetate, cyclohexyl 2-diazo-2-benzenesulfonylacetate, tert-butyl 2-diazo-2-(p-toluenesulfonyl)acetate, 2-nitrobenzyl p-toluenesulfonate, 2,6-dinitrobenzyl p-toluenesulfonate, 2,4-dinitrobenzyl p-trifluoromethylbenzenesulfonate.

Other suitable examples of photogenerators are hexafluorotetrabromo-bisphenol A, 1,1,1-tris(3,5-dibromo-4-hydroxyphenyl)ethane and N-(2,4,6-tribromophenyl)-N'-(p-toluenesulfonyl)urea.

More preferably, the photoacid generators can be chosen from the following compounds:

VI

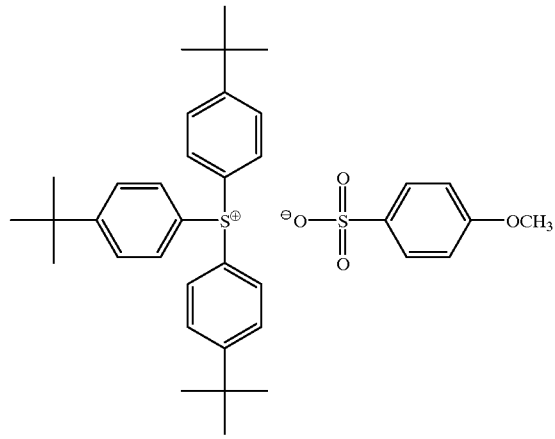

VII

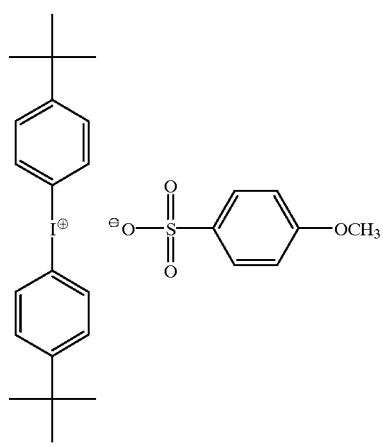

VIII

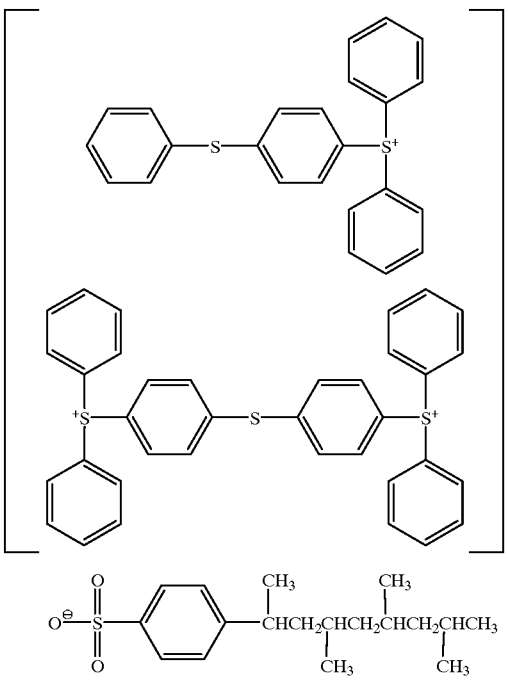

IX

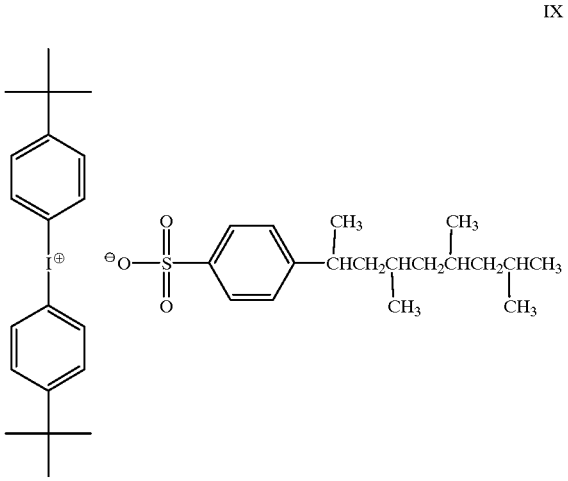

X

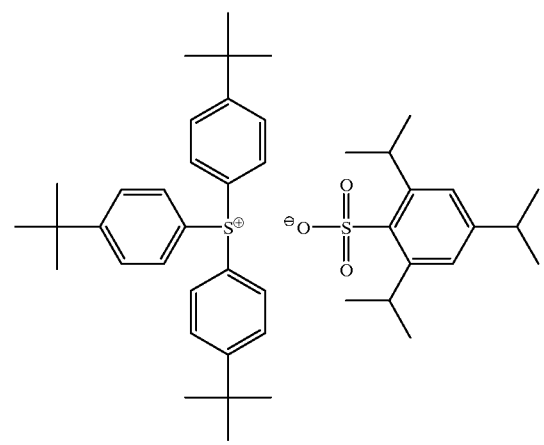

-continued

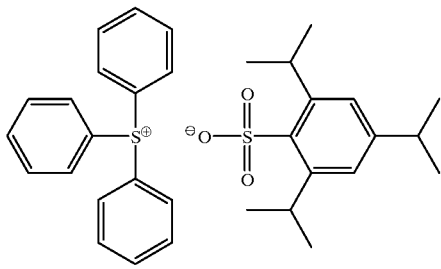

XI

The photoacid generator compound is typically employed in the amounts of about 0.0001 to about 20% by weight of polymer solids and more preferably about 1% to about 10% by weight of polymer solids.

The choice of solvent for the photoresist composition and the concentration thereof depends principally on the type of functionalities incorporated in the acetal polymer, the photoacid generator, and the coating method. The solvent should be inert, should dissolve all the components in the photoresist, should not undergo any chemical reaction with the components and should be re-removable on drying after coating. Suitable solvents for the photoresist composition may include ketones, ethers and esters, such as methyl ethyl ketone, methyl isobutyl ketone, 2-heptanone, cyclopentanone, cyclehexanone, 2-methoxy-1-propylene acetate, 2-methoxyethanol, 2-ethoxyothanol, 2-ethoxyethyl acetate, 1-methoxy-2-propyl acetate, 1,2-dimethoxy ethane ethyl acetate, cellosolve acetate, propylene glycol monoethyl ether acetate, methyl lactate, ethyl lactate, methyl pyrmvate, ethyl pyruvate, methyl 3-methoxypropionate, ethyl 3-methoxypropionate, N-methyl-2-pyrrolidone, 1,4-dioxane, ethylene glycol monoisopropyl ether, diethylene glycol monoethyl ether, diethylene glycol monomethyl ether, diethylene glycol dimethyl ether, and the like.

In an additional embodiment, base additives may be added to the photoresist composition. The purpose of the base additive is to scavenge protons present in the photoresist prior to being irradiated by the actinic radiation. The base prevents attack and cleavage of the acid labile groups by the undesirable acids thereby increasng the performance and stability of the resist. The percentage of base in the composition should be significantly lower than the photoacid generator because it would not be desirable for the base to interfere with the cleavage of the acid labile groups after the photoresist composition is irradiated. The preferred range of the base compounds, when present, is about 3% to about 50% by weight of the photoacid generator compound. Suitable examples of base additives are 2-methylimidazole, trrisopropylamine, 4-dimethylaminopryidine, 4,4'-diaminodiphenyl ether, 2,4,5 triphenyl imidazole and 1,5-diazobicyclo[4.3.0]non-5-ene.

Dyes may be added to the photoresist to increase the absorption of the composition to the actinic radiation wavelength. The dye must not poison the composition and must be capable of withstanding the process conditions including any thermal treatments. Examples of suitable dyes are fluorenone derivatives, anthracene derivatives or pyrene derivatives. Other specific dyes that are suitable for photoresist compositions are described in U.S. Pat. No. 5,593,812.

The photoresist composition may flrther comprise conventional additives such as adhesion promoters and surfactants. A person skilled in the art will be able to choose the appropriate desired additive and its concentration.

The invention further relates to a process for forming a pattern on a substrate which comprises the following process steps: application of a photoresist coating comprising one of the compositions described above to the substrate; image-wise exposure of the coating to actinic radiation; treatment of the coating with an alkaline aqueous developer until the areas of the coating which have been exposed to the radiation detach from the substrate and an imaged photoresist structured coating remains on the substrate.

The photoresist composition is applied uniformly to a substrate by known coating methods. For example the coatings may be applied by spin-coating, dipping, knife coating, lamination, brushing, spraying, and reverse-roll coating. The coating tickness range generally covers values of about 0.1 to more than 10 μm. After the coating operation, the solvent is generally removed by drying. The drying step is typically a heating step called soft bake where the resist and substrate are heated to a temperature of about 50° C. to about 150° C. for about a few seconds to about a few minutes; preferably for about 5 seconds to about 30 minutes depending on the thickness, the heating element and end use of the resist.

The photoresist compositions are suitable for a number of different uses in the electronics industry. For example, it can be used as electroplating resist, plasma etch resist, solder resist, resist for the production of prnting plates, resist for chemical milting or resist in the production of integrated circuits. The possible coatings and processing conditions of the coated substrates differ accordingly.

For the production of relief structures, the substrate coated with the photoresist composition is exposed imagewise. The term 'imagewise' exposure includes both exposure through a photomask containing a predetermined pattern, exposure by means of a computer controlled laser beam which is moved over the surface of the coated substrate, exposure by means of computer-controlled electron beams, and exposure by means of X-rays or UV rays through a corresponding mask.

Radiation sources which can be used are all sources which emit radiation in which the photoacid generator is sensitive. Examples are argon ion, krypton ion, electron beams and x-rays sources.

The process described above for the production of relief structures preferably comprises, as a further process measure, heating of the coating between exposure and treatment with the developer. With the aid of this heat treatment, known as "post-exposure bake", virtiily complete reaction of the acid labile groups in the polymer resin with the acid generated by the exposure is achieved. The duration and temperature of this post-exposure bake can vary within broad limits and depend essentially on the functionalities of the polymer resin, the type of acid generator and on the concentration of these two components. The exposed resist is typically subjected to temperatures of about 50° C. to about 150° C. for a few seconds to a few minutes. The preferred post exposure bake is from about 80° C. to 13° C. for about 5 seconds to about 300 seconds.

After imagewise exposure and any heat treatment of the material the exposed areas of the photoresist are removed by dissolution in a developer. The choice of the particular developer depends on the type of photoresist; in particular on the nature of the polymer resin or the photolysis products generated. The developer can comprise aqueous solutions of bases to which organic solvents or mixtures thereof may have been added. Particularly preferred developers are aqueous alkaline solutions. These include, for example, aqueous solutions of alkali metal silicates, phosphates, hydroxides and carbonates, but in particular of tetra alkylammonium hydroxides, and more preferably tetramethylammonium hydroxide (TMAH). If desired, relatively small amounts of wetting agents and/or organic solvents can also be added to these solutions.

After the development step, the substrate carrying the resist coating is generally subjected to at least one further treatment step which changes substrate in areas not covered by the photoresist coating. Typically, this can be implantation of a dopant, deposition of another material on the substrate or an etching of the substrate. This is usually followed by the removal of the resist coating from the substrate typically by an oxygen plasma etch or a wet solvent strip.

This invention is explained below in further detail with references to examples, which are not by way of limitation, but by way of illustration.

Examples 1 and 2 below illustrate the synthesis procedure involved in generating the acetal polymers.

EXAMPLE 1

Synthesis of Mixed Phenethyl and Tertiarybutyl Acetals of Polyhydroxystyrene

A mixture of 100 ml of tetrahydrofiran (THF) and 30 g of powdered polyhydroxystyrene (PHS) was added to a 250 ml three-necked flask equipped with a temperature probe, an overhead mechanical stirrer and a nitrogen inlet. The mixture stirred for 30 minutes to form a homogeneous solution before 5.0 g of tertiary butyl vinyl ether, 4.8 g of phenethyl alcohol and 140 mg of solid pyridinium-para-toluene sulfonate was added. A brief exotherm was observed followed by a temperature rise of 23° to 27° C. The solution was allowed to stir at 23° C. for 20 hours before 4 g of triethylamine solution (prepared by dissolving 2.31 g of triethylamine in 200 g of THF) was added to the reaction mixture to quench the acid. The reaction mite was stirred for additional 30 minutes. The polymer solution was drop-wise added to 1000 ml of de-ionized water under vigorous stirring. The precipitated solid polymer was isolated by filtration. The polymer was washed two times with 250 ml of de-ionized water. The polymer was dried under vacuum at 60° C. for 18 hours.

EXAMPLE 2

Synthesis of Mixed Phenethyl and Tertiary-butyl Acetals of Polyhydroxystyrene (Alternative n-situ Synthesis Process)

A mixture of 140.6 g of propylene glycol monomethyl ether acetate (PGMEA) and g of powdered PHS was added to a 250 ml three-necked flask equipped with a temperature probe, an overhead mechanical stirrer and a nitrogen inlet. The mixture was stirred for 30 minutes to form a homogeneous solution The mixture was then heated to 66° C. and vacuum was applied to the solution to distill 12 g of the solvent. The solution was allowed to cool to room temperature under nitrogen atmosphere and 5.0 g of tertiary-butyl vinyl ether, 4.8 g of phenethyl alcohol and 140 mg of solid pyridinium para-toluene sulfonate was added to the solution A brief exotherm was observed followed by a temperature rise of 23° C. to 27° C. The solution was allowed to stir at 23° C. for about 20 hours before 4 g of triethylamine solution (prepared by dissolving 2.81 g of triethylamine in 200 g of THF) was added to the reaction mixture to quench the acid. The reaction mixture was starred for additional 30 minutes. The polymer solution was transferred to a 250 ml separatory funnel and washed with 115 g of acetone, 115 g of hexanes and 47 g of de-ionized water. The mixture was stirred briefly for 5 minutes and allowed to separate into two layers. The lower aqueous layer was discarded. The top organic layer was subjected to two more washings. The top organic layer was transferred to a 500 ml round-bottom, three-necked flask The flask was equipped with a temperature probe, an overhead stirrer and a vacuum distillation assembly. The flask was placed on a heating mantle and the organic volatiles from the polymer solution were removed by atmospheric distillation at about 70° C. The final traces of low volatile solvents were removed by applying vacuum The remaining polymer solution was diluted to a solid content of about 30 weight percent.

EXAMPLES 3–19

Following the synthesis procedures described in Example 1 and 2, a wide variety of acetal blocked polyhydroxystyrene (PHS) based polymers and copolymers were synthesized. The degree of acetalization (DA) was controlled by varying the amount of vinyl ether. The proportion of $R_2$ in the polymer was controlled by adjusting the vinyl alcohol ratio. The %$R_2$ is calculated by the formula $(b/(a+b+c))\times 100$.

The acetal polymers are shown in Table I with the indicated polydispersity (PD). degree of acetalization (DA%) was determined by $^{13}$C-NMR and the amount of $R_2$ incorporated was determined by $^1$H-NMR. $R_6$ and $R_7$ for each of the vinyl ethers are hydrogen.

TABLE I

| Example | Description of Polymer | $R_1$ | $R_2$ (Alcohol) | $R_1/R_2$ attempted | % $R_2$ | % DA |
|---|---|---|---|---|---|---|
| 3 | Polymer A<br>PHS; MW = 12,000<br>PD = 1.04 | t-butyl | — | — | — | 31 |
| 4 | Polymer A | t-butyl | Phenethyl | 1/0.75 | 22 | 29 |
| 5 | Polymer A | t-butyl | Phenethyl | 1/0.5 | 10.4 | 22 |
| 6 | Polymer A | cyclohexyl | Phenethyl | 1/0.5 | 22 | 26 |
| 7 | Polymer B<br>Poly(styrenecohydroxy styrene); % styrene = 17%<br>Mw = 9,000; PD = 1.5 | t-butyl | Phenethyl | 1/0.5 | 10 | 20 |
| 8 | Polymer B | t-butyl | Phenethyl | 1/0.75 | 17.8 | 24 |
| 9 | Polymer C<br>Poly(tertiary-butyl styrene-co-hydroxy Styrene) % t-butyl styrene = 7%<br>Mw = 12,000; PD = 1.9 | t-butyl | Phenethyl | 1/0.8 | 19.8 | 20 |
| 10 | Polymer C | t-butyl | phenethyl | 1/0.8 | 14.6 | 18 |
| 11 | Polymer A | t-butyl | 2,2,3,3-tetrafluoro propyl (TFP) | 1/0.25 | 8 | 29 |
| 12 | Polymer A | t-butyl | Naphthyl ethyl | 1/0.25 | 9.5 | 31 |

TABLE I-continued

| Example | Description of Polymer | $R_1$ | $R_2$ (Alcohol) | $R_1/R_2$ attempted | % $R_2$ | % DA |
|---|---|---|---|---|---|---|
| 13 | Polymer A | t-butyl | Naphthyl ethyl | 1/0.5 | 9.7 | 23 |
| 14 | Polymer A | t-butyl | 1-cyclohexyl ethyl | 1/0.5 | 14.2 | 33 |
| 15 | Polymer A | t-butyl | 1-cyclohexyl ethyl | 1/0.25 | 7.9 | 31 |
| 16 | Polymer C | t-butyl | 1-cyclohexyl ethyl | 1/0.8 | 14 | 18 |
| 17 | Polymer A | t-butyl | (1R)-(−)-nopyl | 1/0.5 | 9.9 | 30 |
| 18 | Polymer A | t-butyl | (1R)-(−)-nopyl | 1/0.25 | 5.5 | 28 |
| 19 | Polymer D poly(t-butyl acrylate-co-hydroxy styrene) % t-butyl acrylate = 30% | t-butyl | phenethyl | 1/0.8 | 23 | 30 |
| *20 | Polymer A | t-butyl | phenethyl | 1/1 | 17 | 17 |

*Analysis by $^1$H-NMR indicated that all the acetal moieties in the polymer were substituted with phenethyl groups.

EXAMPLE 21–24

Reproducibility of Synthesis Procedures

To test the reproducibility of the synthesis procedures described above, four experiments were run under identical conditions according to examples 1 and 2; wherein $R_1$ is tert-butyl, $R_2$ is phenethyl, and $R_6$ and $R_7$ are hydrogen. The vinyl ether and alcohol mole percentages are based on the total moles of phenolic hydroxyl groups in the polymer. Table II summarizes the results of the experiments.

TABLE 11

| Example | Polymer from Table I | Amount | Mole % $R_1$ in feedstock | mole % $R_2$ in feedstock | DA % $^{13}$C-NMR | % $R_2$ incorp. $^1$H-NMR |
|---|---|---|---|---|---|---|
| 21 | Polymer A | 30 g | 30 | 22.5 | 23 | 16 |
| 22 | Polymer A | 30 g | 30 | 22.5 | 23.8 | 15 |
| 23 | Polymer A | 30 g | 30 | 22.5 | 24.9 | 15.8 |
| 24 | Polymer B | 30 g | 30 | 22.5 | 24 | 17.8 |

The results of Table II show that the DA % and the percent of the $R_2$ acetal present in the PHS based polymer is highly reproducible varying by less than ±1%.

EXAMPLE 25

Synthesis of a Polyhydroxystyrene Based Polymer with Mixed Phenethyl and Tertiary-butyl Acetals and a Tertiary Butoxycarbonyl-oxy (t-BOC) Group To a round bottom flask containing 100 g of 30 weight percent solution of polyhydroxystyrene based polymer of mixed phenethyl and t-butyl acetal in 1-methoxy-2-propyl acetate produced according to example 21, 5.0 mg of dimethyl amino pyridine was added. The mixture was stirred by an overhead stirrer for about 30 minutes before 2.72 g of di-tertiary-butyl dicarbonate was added. The solution was allowed to homogenize for about 15 minutes. The mixture was then stirred for about 32 hours under nitrogen conditions until the reaction was completed as measured by FTIR.

EXAMPLES 26–29

The examples in Table III below shows how resist properties can be modified by utilizing different acetal functionalities. Specifically, the glass transition temperature (Tg) and the alkaline solubility properties (Tc) were altered by using a variety of alcohols together with t-butyl vinyl ether and polyhydroxystyrene (PHS) polymers. Tc is the length of time in seconds for a 1.0 μm film of the polymer to be removed from a substrate in 0.5 N TMAH. The control PHS used a less concentrated TMAH solution (0.26 N) so that the time of removal could be accurately measured.

TABLE III

| Example | $R_1$ | $R_2$ (alcohol) | $R_1/R_2$ (mole) in feed stock | % mole $R_2$ in polymer | % DA | Tg (° C.) | Tc (sec) |
|---|---|---|---|---|---|---|---|
| Control (PHS) | — | — | 0 | 0 | 0 | 165 | 4 (0.26N TMAH) |
| 26 (PHS) | t-butyl | — | — | 0 | 34 | 115 | 80 |
| 27 (PHS) | t-butyl | 2,2,3,3,-tetrafluoropropyl alcohol | 1/0.25 | 8 | 29 | 83 | 89 |
| 28 (PHS) | t-butyl | phenethyl | 1/0.5 | 10.4 | 22 | 116 | 98 |
| 29 (PHS) | t-butyl | naphthyl ethyl | 1/0.25 | 9.5 | 31 | 90 | 444 |

EXAMPLES 30–35

Formulating, Coating, Baking, Exposure, Post Exposure Baking, and Developing of the Photoresists The following general procedure was followed for the formulation and development of the positive photoresist.

Photoresist formulations were prepared by blending the following components in amber colored glass bottles.

Acetal derivatized hydroxystyrene based polymer solution in 1-methoxy-2-propylene acetate (30% solution) (8.7 g)

Photoacid generator (PAG) (formula VIII) (0.27 g)

2,4,5 triphenyl imidazole (0.0675 g) (Base additive)

1,5-diazobicyclo[4.3.0]non-5-ene (0.045 g) (Base additive)

FLUORAD FC-430 (fluoroaliphatic polymeric esters) (Surfactant)

Solvent: 2-methoxy-1-propylene acetate (15.9 g)

When all the components had dissolved, the resist samples were micro filtered directly into clean bottles.

Silicon wafers were spin coated by applying 3 ml of photoresist formulations to static four inch wafers. The wafers were then spun to give a uniform film thickness of around 7600 Å. These photoresist coated wafers were then soft baked (SB) to remove the residual solvents. The soft-baked photoresist coated wafers were then exposed using 248 nm wavelength light on an ISI XLS 0.53 NA stepper. After completion of exposure, the wafers were subjected to a post exposure bake (PEB). Following the PEB, the wafers were puddle or spray-developed using a 0.26 N tetramethyl ammonium hydroxide aqueous developer. A de-ionized water rinse was applied for 20 seconds while spinning, followed by dry nitrogen gas to dry the wafers.

Each imaged photoresist-coated substrate was evaluated for several important properties, such as optimum photo-speed (Eopt), standing waves and equal line/space pair resolution (res.). The degree of standing waves were qualitatively evaluated on a scale of 1 to 5 where 1 is poor and 5 is excellent. The % film shrinkage was calculated by measuring the thickness before exposure T1, and the thickness of the film after exposure T2. The % film shrinkage is the difference in thickness before and after the exposure and is calculated by the formula $((T1-T2)/T1) \times 100$. All the components in the photoresist are the same as example 30 except for the acetal polymers. The results are summarized in Table IV.

TABLE IV

| Example | Polymer described in Table I | $E_{opt}$ (mJ/cm$^2$) | Resolution $\mu$m | Standing wave | % Film Shrinkage |
|---|---|---|---|---|---|
| 30 | Example 3 | 12 | 0.2 | 1 | 11 |
| 31 | Example 4 | 24 | 0.175 | 4–5 | 26 |
| 32 | Example 7 | 21 | 0.2 | 5 | 0.6 |
| 33 | Example 15 | 24 | 0.175 | 4 | 0.79 |
| 34 | Example 10 | 25 | 0.175 | 5 | <1.0 |
| 35 | Example 25 | 32 | 0.175 | — | <1.0 |

The results show that all the photoresist compositions have excellent resolution of 0.2 $\mu$m and below with good sensitivity. Most compositions also have good film shrinae and standing wave properties.

The foregoing is illustrative 6f the present invention and is not construed as limiting thereof. The invention is defined by the following claims with equivalents of the claims to be included therein.

What is claimed is:

1. A mixed acetal derivatized polymer comprising: a polymer having the following monomer units;

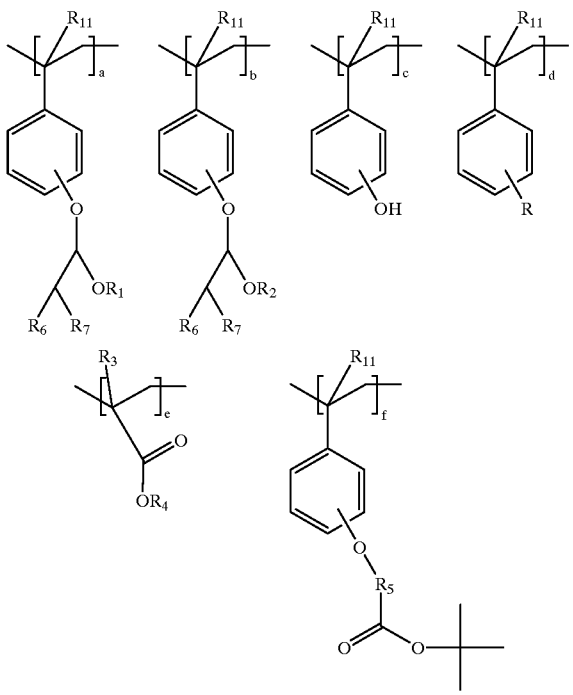

wherein R is a hydrogen, alkyl alkoxy or acetoxy; $R_1$ is a linear, branched or cyclic alkyl group, a linear, branched or cyclic haloalkyl group, an aralkyl group, or a substituted phenylmethylene having the general structure

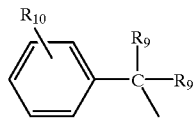

wherein each $R_9$ and $R_{10}$ are the same or independently a hydrogen or an alkyl group having 1 to 6 carbons; $R_2$ is a linear, branched or cyclic alkyl group, a linear, branched or cyclic halogenated alkyl group, an aromatic group, or a substituted phenylmethylene having the general structure

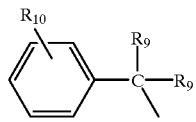

wherein $R_9$ and $R_{10}$ are as defined above; $R_1$ and $R_2$ are different from each other; $R_3$ is a hydrogen atom, methyl or ethyl group; or a group having the formula —CH$_2$—COOR$_8$; $R_4$ and $R_8$ are the same or independently a linear, branched or cyclic alkyl group, a linear, branched or cyclic halogenated alkyl group, an aromatic group or a linear or cyclic α-alkoxyalkyl group; $R_5$ is a valence bond or methylene; $R_6$ and $R_7$ are the same or independently a hydrogen, a linear, branched or cyclic alkyl group, a linear, branched or cyclic haloalkyl group, an aryl group, an aralkyl group, a substituted haloaryl, alkoxyaryl or alkylaryl group, or a combination of $R_6$ and $R_7$ being able to form an alkylene chain, an alkyl substituted alkylene chain, or an oxyalkylene chain; $R_{11}$ is hydrogen or methyl; $0<a\leq0.6$; $0<b\leq0.6$; $f=0$ to $0.10$; $0<a+b+f\leq0.6$; $0.4\leq c+d+e<1.0$; and $a+b+c+d+e+f=1.0$; and where all numbers represent mole fractions.

2. A mixed acetal polymer of claim 1 wherein $R_6$, $R_7$ and $R_{11}$ are hydrogen, and $R_1$ is ethyl, tertiary-butyl or cyclohexyl.

3. The mixed acetal polymer of claim 2 wherein $R_4$ is methyl, ethyl, 2-hydroxy ethyl, propyl, isopropyl, n-butyl, t-butyl, 2-ethyl hexyl or tetrahydropyranyl.

4. The mixed acetal polymer of claim 2 wherein $R_2$ is 2,2,3,3-tetrafluoro propyl, cyclohexyl ethyl, (1R)-(−)-nopyl, benzyl, phenethyl, 1-naphthyl, 2-naphthyl or naphthyl ethyl.

5. The mixed acetal polymer of claim 2 wherein $R_1$ is tertiary-butyl, $R_2$ is phenethyl d is 0, e is 0, f is 0, $0.1\leq((a+b)/(a+b+c))\leq0.35$; $0.8\leq(b/(a+b))<1$.

6. The mixed acetal polymer of claim 2 wherein $R_1$ is tertiary-butyl, $R_2$ is phenethyl, e is 0, f is 0, d is 0.05 to 0.25; R is hydrogen; $0.1\leq((a+b)/(a+b+c))\leq0.35$; $0.8\leq(b/(a+b))<1$.

7. The mixed acetal polymer of claim 2 wherein $R_1$ is teriary-butyl, $R_2$ is phenethyl, e is 0, f is 0, d is 0.05 to 0.25; R is tertiary-butyl; $0.1\leq((a+b)/(a+b+c))\leq0.35$; $0.8\leq(b/(a+b))<1$.

8. The mixed acetal polymer of claim 2 wherein $R_1$ is teriary-butyl, $R_2$ is cyclohexyl ethyl, e is 0, f is 0, d is 0.05 to 0.25; R is tertiary-butyl; $0.1\leq((a+b)/(a+b+c))\leq0.35$; $0.8\leq(b/(a+b))<1$.

9. The mixed acetal polymer of claim 2 wherein $R_1$ is tertiary-butyl, $R_2$ is phenethyl, d is 0, f is 0, $0<e\leq0.4$; $R_3$ is hydrogen; $R_4$ is tertiary-butyl; $0.1\leq((a+b)/(a+b+c))\leq0.35$; $0.8\leq(b/(a+b))<1$.

10. The mixed acetal polymer of claim 2 wherein $R_1$ is tertiary-butyl $R_2$ is phenethyl, d is 0, $0<f\leq0.08$, e is 0; $R_5$ is a valence bond; $0.1\leq((a+b)/(a+b+c))\leq0.35$; $0.8\leq(b/(a+b))<1$.

* * * * *